METHOD OF MANUFACTURING SEMICONDUCTOR DEVICE

Filed Sept. 1, 1967 6 Sheets-Sheet 1

INVENTORS
SUMIO NISHIDA
TOSHIZI MOGI

BY Craig & Antonelli
ATTORNEYS

INVENTORS
SUMIO NISHIDA
TOSHIZI MOGI

BY Craig & Antonelli
ATTORNEYS

INVENTORS
SUMIO NISHIDA
TOSHIZI MOGI

BY Craig & Antonelli
ATTORNEYS

METHOD OF MANUFACTURING SEMICONDUCTOR DEVICE

Filed Sept. 1, 1967

INVENTORS
SUMIO NISHIDA
TOSHIZI MOGI

BY Craig & Antonelli

ATTORNEYS

April 21, 1970 SUMIO NISHIDA ET AL 3,507,716

METHOD OF MANUFACTURING SEMICONDUCTOR DEVICE

Filed Sept. 1, 1967 6 Sheets-Sheet 5

INVENTORS
SUMIO NISHIDA
TOSHIZI MOGI

BY Craig & Antonelli
ATTORNEYS

April 21, 1970 SUMIO NISHIDA ET AL 3,507,716

METHOD OF MANUFACTURING SEMICONDUCTOR DEVICE

Filed Sept. 1, 1967 6 Sheets-Sheet 6

INVENTORS
SUMIO NISHIDA
TOSHIZI MOGI

BY Craig & Antonelli

ATTORNEYS

United States Patent Office 3,507,716
Patented Apr. 21, 1970

3,507,716
METHOD OF MANUFACTURING SEMICONDUCTOR DEVICE

Sumio Nishida and Toshizi Mogi, Kodaira-shi, Japan, assignors to Hitachi Ltd., Tokyo, Japan, a corporation of Japan Filed Sept. 1, 1967, Ser. No. 665,144
Claims priority, application Japan, Sept. 2, 1966, 41/57,557
Int. Cl. H01l 7/36, 7/44, 7/50
U.S. Cl. 148—187 8 Claims

ABSTRACT OF THE DISCLOSURE

This specification discloses a method of manufacturing a semiconductor device having its silicon substrate surface covered with a layer consisting of a mixture of $P_2O_5$ and $SiO_2$. In this method, when the mixture layer of $P_2O_5$ and $SiO_2$ is formed on the silicon substrate of which the surface is partially covered with a $SiO_2$ layer, by supplying a gasified phosphorus compound onto said substrate together with a carrier gas, the mixture layer is made to be thicker on the $SiO_2$ layer than on the exposed silicon surface by controlling the quantity of oxygen contained in said carrier gas, thereafter the substrate is immersed in an etchant to uniformly etch said mixture layer so that the thinner mixture layer formed on said silicon surface is removed and thus the silicon surface is again exposed while the mixture layer formed on said layer is left, and then metal electrodes reaching said silicon surface again exposed are formed by, for example, the evaporation method. Thus, there can be obtained a semiconductor device having a very minute electrode structure.

BACKGROUND OF THE INVENTION

This invention relates to a method of manufacturing a semiconductor device, and more particularly it pertains to a method of manufacturing a semiconductor device having its semiconductor substrate surface covered with an insulating coating containing phosphorus oxide, used as diode, transistor, semiconductor integrated circuit device and the like.

Recently, it has been proposed to additionally provide a phosphosilicate glass layer on the $SiO_2$ passivation layer formed on the silicon substrate of a silicon planar type transistor. That is, it has been reported that a semiconductor device with a stabilized surface state of the silicon substrate and hence an improved reliability can be obtained by providing an additional phosphosilicate glass layer on the $SiO_2$ layer as described above (see D. R. Young, D. P. Seraphim et al.; "Surface Effects on Silicon," IBM Journal 8, 4, pp. 366–429 (1964)). As a result of various experiments, the inventors have also confirmed that a semiconductor device including such a phosphosilicate glass layer is improved in respect of the reverse current characteristics of a PN junction reaching the substrate surface which is susceptible to the influences by the external atmosphere over a semiconductor device having no such layer, and that the former, when it is a transistor, is superior to the latter in respect of the current amplification and noise characteristics.

However, since such a phosphosilicate glass layer has a much higher etching speed, when immersed in an etchant, than a $SiO_2$ layer, that is, the former is of such a nature that it is easily etched, there is a disadvantage that great difficulties are encountered in the steps of manufacturing a semiconductor device with such phosphosilicate glass layer. The problems conventionally arising on the way of the manufacture will be described with reference to FIGS. 1*a* to *d*.

FIG. 1*a* shows a semiconductor element wherein a $SiO_2$ layer 4 is provided on the surface of a silicon substrate 1, a diffused region 2 and a PN junction 3 are formed by selectively diffusing impurities into the substrate 1 through using the $SiO_2$ layer as a mask, and a phosphosilicate glass layer 5 is provided on a $SiO_2$ layer formed on said region 2 during said diffusion process and said $SiO_2$ layer 4 used as a mask. In such a semiconductor element, it is required that a hole be formed in the phosphosilicate glass layer 5 and the $SiO_2$ layer on said region 2 for the purpose of forming an electrode reaching said diffused region 2. To this end, a corrosion resisting film 6 is provided on the phosphosilicate glass layer 5 by means of the conventional photo-etching technique as shown in FIG. 1*b*. Thus, the exposed glass layer 5 and the $SiO_2$ layer there-beneath are etched through using the film 6 as a mask, and thereafter the corrosion resisting film 6 is removed to form a hole 7 through which the diffused region 2 is exposed. Subsequently, a metal such as aluminum is evaporated onto such element from above, so that a metal electrode layer 9 is formed extending to the exposed diffused region 2, as shown in FIG. 1*d*.

Such conventional semiconductor device manufacturing method has a disadvantage that when the $SiO_2$ layer on said diffused region 2 and the glass layer are etched, the phosphosilicate glass layer on the terminating end of the PN junction 3 extending to the surface of the semiconductor substrate is completely removed because of the fact that the etching speed of the phosphosilicate glass layer is higher than that of the $SiO_2$ layer on said diffused region 2. Consequently, a semiconductor device thus produced comes to have no such excellent characteristics as described above.

Furthermore, it is required that the area occupied by the diffused region or the dimension thereof be made as small as possible in order to improve the high-frequency characteristics of a semiconductor device. However, the conventional method as described above is disadvantageous in that the reduction of dimension of said semiconductor device is limited by the masking accuracy of the corrosion-resisting film since it is required that the hole for the electrode be formed through using the corrosion-resisting film as a mask, as described with reference to FIG. 1*b*. In view of the foregoing, it has been desired that a new and improved method be developed for forming a hole to provide an electrode on a semiconductor element having a phosphosilicate glass layer provided on the surface thereof.

SUMMARY OF THE INVENTION

It is an object of the present invention to provide a new and improved method of manufacturing a semiconductor device which has an insulating coating on the surface of the substrate thereof.

It is another object of the present invention to provide a new and improved method of manufacturing a semiconductor device, which has at least one P-N junction terminated at the semiconductor substrate surface, said termination of the P-N junction being covered with an insulating coating containing phosphorus oxide.

It is still another object of this invention to provide a new and improved method of manufacturing a semiconductor device having at least one diffused region which occupies a very small area and the periphery of which is covered with a surface coating including phosphorus oxide and silicon oxide.

A further object of this invention is to provide a new and improved method of forming a metal electrode to a semiconductor element which has at least one P-N junction terminated by the surface of the semiconductor substrate and an insulating coating including phosphorus oxide covering the termination of the P-N junction.

A still further object of this invention is to provide a new and improved method of manufacturing a silicon transistor of which the surface is covered with a first insulating coating including a silicon oxide layer which is covered with a second insulating coating containing phosphorus oxide and silicon oxide.

The foregoing and other objects, features and advantages of this invention will become apparent from the following description taken in conjunction with the accompanying drawings.

DESCRIPTION OF PREFERRED EMBODIMENTS

The method of manufacturing a semiconductor device in accordance with an embodiment of the present invention will be described in detail with reference to FIGS. 2*a* to 2*d*.

Figure 1A:
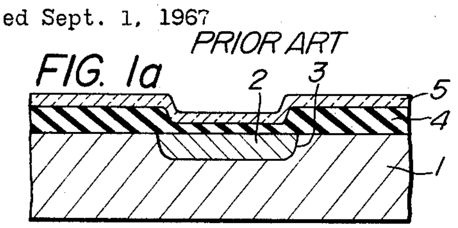
FIG. 1a PRIOR ART
FIGS. 1*a* through 1*d* are sectional views illustrating the fabrication of a semiconductor device according to the prior art.
Figure 2A:
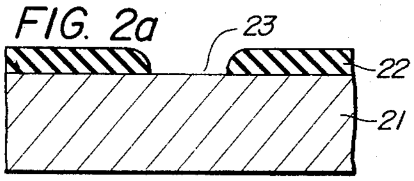
FIGS. 2*a* through 2*d* are sectional views illustrating the manufacture of a semiconductor device in accordance with the present invention.
Figure 1B:
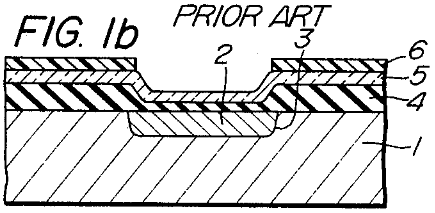
FIG. 1b PRIOR ART

First, preparation is made for a semiconductor element comprising a P type silicon substrate 21 and a silicon oxide layer 22 having a thickness of approximately 3000 to 20,000 A. which is partially provided on the surface of said substrate 21, the substrate surface 23 covered with no such silicon oxide layer being exposed, as shown in FIG. 2*a*. Such element may be produced by subjecting a P type silicon wafer 21 with a thickness of about 300$\mu$ having a cleaned mirror surface to heat treatment at about 1200° C. in a wet oxygen atmosphere for 20 minutes so as to form a silicon oxide layer 22 in a thickness of approximately 5000 A. on the surface of said wafer, and thereafter forming a hole 5$\mu$ in diameter in said silicon oxide layer by the conventional photoetching technique, said hole extending to the silicon substrate surface 23.

Figure 2B:
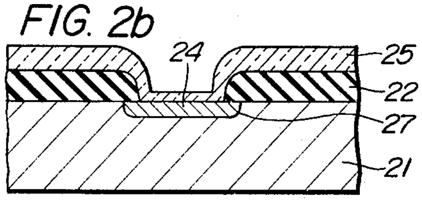
Figure 1C:
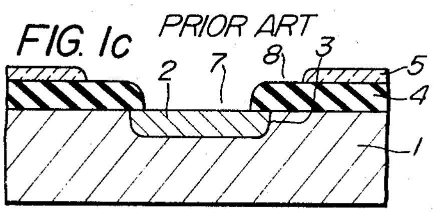
FIG. 1c PRIOR ART
Figure 3:
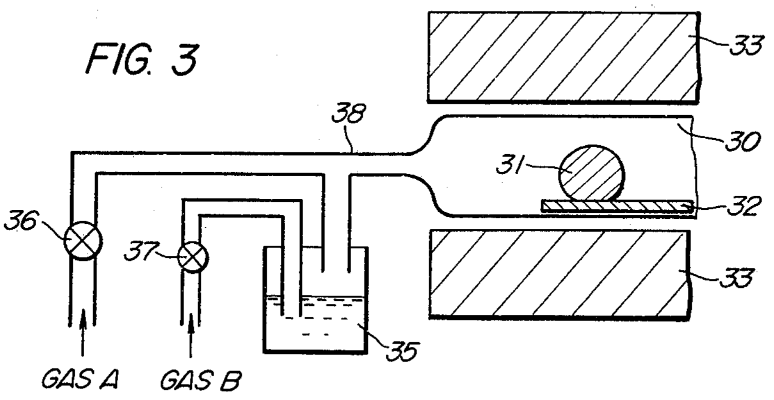
FIG. 3 is a schematic view showing an apparatus adapted to be used in the method of manufacturing a semiconductor device in accordance with the present invention.

Subsequently, phosphorus oxide is deposited on the surface of such semiconductor element with the aid of the apparatus as shown in FIG. 3, so that a phosphorus diffused layer 24 is formed and simultaneously a mixture layer 25 of phosphorus oxide and silicon oxide is formed on said silicon oxide layer 22 and said silicon substrate surface 23 as shown in FIG. 2*b*.

Description will now be made of the impurity diffusing apparatus as shown in FIG. 3. In this figure, the reference numeral 30 represents a reaction tube, 33 a heating device, 38 a pipe for supplying a carrier gas (mixed gas of an inert gas such as $N_2$, Ar, He or the like and $O_2$) containing an impurity into the reaction tube, 35 an impurity source consisting of a phosphorus compound such as, for example, $POCl_3$, $PCl_3$ or $PBr_3$, 36 and 37 valves for controlling the flow of gases A and B respectively, 31 a semiconductor element inserted in the reaction tube, and 32 a support for supporting the semiconductor element 31.

The present inventors inserted a semiconductor element as described with reference to FIG. 2*a* into the reaction tube heated a about 1025° C., used liquid phosphorus oxychloride maintained at about 0 to 5° C. as the impurity source 35, and measured the thickness of the mixture layer of phosphorus oxide and silicon oxide formed on the surface of the said semiconductor element, with the composition and flow rate of the gases A and B variously controlled. In the experiment, use was made of a mixed gas of $N_2$ and $O_2$ as the carrier gas.

Figure 4:
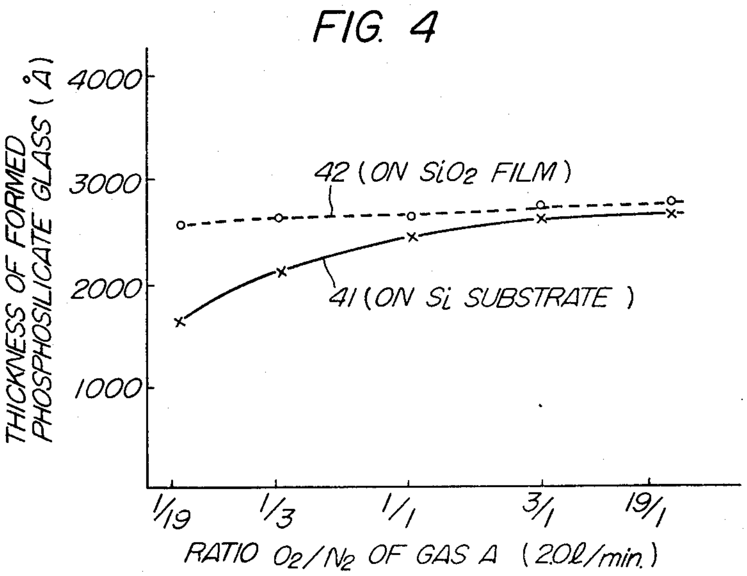
FIGS. 4, 5, 6 and 7 are views showing the experimental results obtained by the method of manufacturing a semiconductor device in accordance with the present invention, respectively.

FIG. 4 shows the relationship between the ratio of $O_2/N_2$ in the gas A and the thickness of the mixture layer of phosphorus oxide and silicon oxide which is formed on the surface of the semiconductor element in about 30 minutes when $N_2$ is supplied as the gas B at a rate of 0.5 l./minute and a mixed gas of $N_2$ and $O_2$ is supplied as the gas A at a rate 2.0 l./minute by opening the valves 36 and 37. In this figure, the horizontal axis indicates the ratio of $O_2$ to $N_2$ contained in the gas A (2.0 l./min.), and the vertical axis represents the thickness (A.) of the mixture layer of phosphorus oxide and silicon oxide formed on the surface of the semiconductor element. The curve 41 shows the state of the mixture layer formed on the exposed surface 23 of the silicon substrate as described with reference to FIG. 2*a*, and the curve 42 represents the state of the mixture layer formed on the silicon oxide layer 22. As a result of the present experiment, the inventors have found that with the ratio $O_2/N_2$ of the gas A lower than 1/1, there occurs a remarkable difference in thickness between the mixture layer of phosphorus oxide and silicon oxide formed on the silicon substrate surface and that formed on silicon oxide layer. For example, if the ratio $O_2/N_2$ is 1/3, the mixture layer formed on the silicon oxide layer becomes about 500 A. thicker than that formed on the surface of the silicon substrate. In the case where the ratio $O_2/N_2$ of the gas A (2.0 l./minute) is 1/3 and the flow rate of gas B ($N_2$) is 0.5 l./min., a mixed gas of $N_2$ at 2.0 l./min. and $O_2$ at 0.5 l./min. in total is caused to flow into the reaction tube 30 through the pipe 38 as the carrier gas for conveying the impurity. In this case, the quantity of $O_2$ is 20% of that of the carrier gas.

Figure 5:
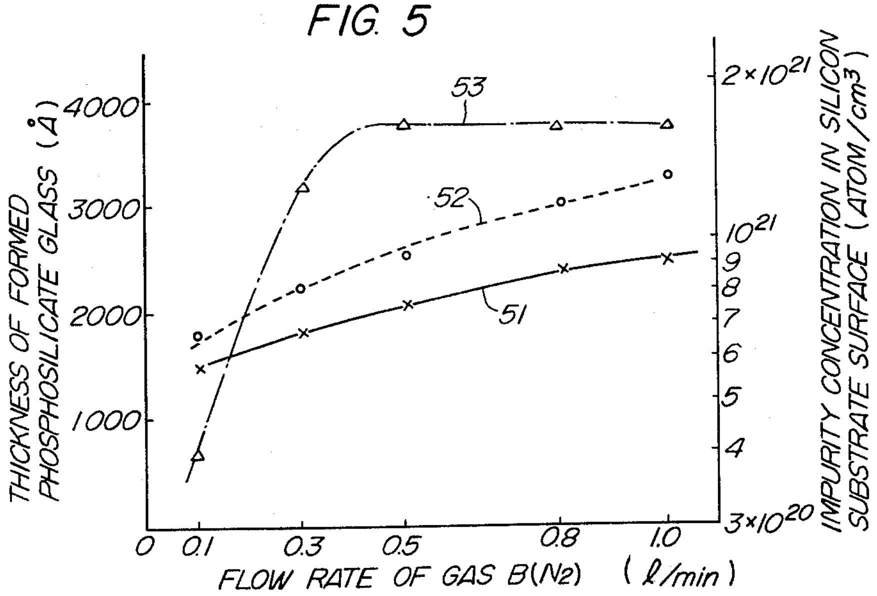

FIG. 5 shows the relationship between the flow rate of the gas B and the thickness of the mixture layer which is formed on the semiconductor element in about 30 minutes by controlling the flow rate of the gas B when a mixed gas of $N_2$ and $O_2$ is supplied as the gas A at a rate of 2.5 l./min. ($N_2$ at 2.0 l./min. and $O_2$ at 0.5 l./min.) and $N_2$ is supplied as the gas B by opening the valves 36 and 37. In this figure, the horizontal axis indicates the flow rate (unit: l./min.) of the nitrogen gas in the gas B, and the scale of the vertical axis on the left hand side represents the thickness (unit: A.) of the mixture layer formed on the semiconductor element, the scale of the vertical axis on the right hand side indicating in logarithm the concentration of impurity in the surface of the silicon substrate. In this figure, the curve 51 shows the state of the mixture layer formed on the surface of the silicon substrate, the curve 52 represents the state of the mixture layer formed on the silicon oxide layer, and the curve 53 shows how the concentration of impurity in the surface of the silicon substrate varies. As will be seen from this figure, the greater the flow rate of the $N_2$ gas as gas B, the greater becomes the thickness of the mixture layer of phosphorus oxide and silicon oxide formed on the surface of the semiconductor element. Furthermore, if the flow rate of the $N_2$ gas becomes higher than about 0.5 l./min., the concentration of impurity in the surface of the silicon substrate assumes a substantially constant value of $1.5 \times 10^{21}$ atoms/cm.$^3$. As a result of this experiment, it has also been found that in case $N_2$ is supplied as the gas B at a rate of 1.0 l./min., a mixture layer is formed in a thickness of about 3300 A. on the silicon oxide layer while such layer is formed in a thickness of about 2500 A. on the silicon substrate, the difference in thickness between these two layers being about 800 A. In the case where $N_2$ is supplied at a rate of 1.0 l./min. as the gas B, $N_2$ and $O_2$ in total are supplied into the reaction tube 30 at 3.0 l./min. and 0.5 l./min., respectively.

When use is made of phosphorus oxychloride ($POCl_3$) as the impurity source, it may be considered that a mixture layer of phosphorus oxide and silicon oxide is formed on the semiconductor element through the following chemical reaction.

That is $POCl_3$ delivered into the reaction tube is converted to $P_2O_5$ through the following chemical reaction in an oxygen atmosphere.

$$4POCl_3+3O_2 \rightarrow 2P_2O_5+6Cl_2 \quad (1)$$

In turn, $P_2O_5$ reacts with the silicon oxide layer (this is considered to consist substantially of $SiO_2$), with a result that a mixture layer or glass layer is formed as described by the following expression.

$$P_2O_5+SiO_2 \rightarrow [P_2O_5-SiO_2] \quad (2)$$

In this case, it is presumed that the formation of said mixture layer is also effected in the silicon oxide layer through diffusion of phosphor, $O_2$ or phosphorus oxide in the silicon oxide layer.

On the other hand, it is presumed that the exposed surface of the silicon substrate is heated at an elevated temperature in an oxygen atmosphere and consequently the following reaction occurs in said surface so that a thin silicon oxide film is formed thereon which in turn reacts with $P_2O_5$ as is the case with said silicon oxide layer, with a result that a mixture layer of $SiO_2$ and $P_2O_5$ or glass layer is formed.

$$Si+O_2 \rightarrow SiO_2 \quad (3)$$

Substantially simultaneously with the steps as described above, phosphorus is caused to diffuse into the silicon substrate 21 with the silicon oxide layer serving as a mask, so that a diffused layer about 0.5 to 2$\mu$ in thickness is formed and thus P-N junction is formed between said diffused layer and the P type substrate. The terminating end of the P-N junction reaching the surface of the substrate is covered with the silicon oxide layer.

Furthermore, the inventors performed experiments similar to those described above by using as the impurity source 35 described with reference to FIG. 3 phosphorus tribromide ($PBr_3$) or phosphorus trichloride ($PCl_3$) instead of $POCl_3$ and obtained experimental results substantially equal to those obtained by using $POCl_3$. However, in view of the fact that $POCl_3$ is relatively stable and easy to handle as compared with $PBr_3$ or $PCl_3$, description will hereinafter be made of the case where use is made of $POCl_3$ as the impurity source, although it is to be understood that the method of fabricating a semiconductor device in accordance with the present invention can equally be applied in the case where an impurity source such as $PBr_3$, $PCl_3$ or the like is used, like in the case where $POCl_3$ is employed.

The thickness of the $SiO_2$ film formed on the exposed surface of the silicon substrate depends upon the quantity of oxygen supplied, as will be seen from the above chemical Equation 3. That is, the smaller the quantity of oxygen, the smaller becomes the thickness of the $SiO_2$ film formed, and hence the thinner becomes the mixture layer or glass layer formed through combination of said $SiO_2$ film with $P_2O_5$ deposited thereon.

From the foregoing, it is presumed that the quantity of oxygen supplied has effect on the difference in thickness between the mixture layer or glass layer formed on the exposed surface of the silicon substrate and that formed on the silicon oxide layer.

Such presumption is proved from the experimental results described with reference to FIG. 4 and/or FIG. 7. That is, as will be seen from FIG. 4 and/or FIG. 7, with decrease in the ratio of $O_2$ in the carrier gas or the flow rate thereof, the thickness of the mixture layer or glass layer formed on the substrate of the silicon substrate becomes smaller while the mixture layer or glass layer is formed in a substantially uniform thickness irrespective of the ratio of $O_2$ or flow rate thereof.

In the method of manufacturing a semiconductor device in accordance with the present invention, it is desired that a carrier gas containing $O_2$ in a sufficient quantity to form phosphorus oxide ($P_2O_5$) through reaction at least with a phosphorus compound and to form a silicon oxide ($SiO_2$) film by oxidizing the exposed surface of the silicon substrate, exists in the reaction tube as described hereinbefore.

Furthermore, assume that the principle of the present invention is based on the foregoing reasons, then it may be considered that the method of this invention can be applied not only in case use is made of a liquid phosphorus compound such as $POCl_3$, $PCl_3$, $PBr_3$ or the like but also in case use is made of a phosphorus compound such as $PCl_5$, $PBr_5$, $P_2O_5$ or the like which is in solid state at a room temperature. If $P_2O_5$ is used as an impurity, then the quantity of $O_2$ in the carrier gas may be further decreased.

Now, the quantity of the phosphorus compound supplied into the reaction tube in the above experiment will be determined, and then the quantity of $O_2$ required to completely react with the phosphorus compound thus supplied to form $P_2O_5$ in accordance with the above chemical Equation 1 will be estimated therefrom. In the experiment described with reference to FIG. 4, for example, about 3.5 grams of $POCl_3$ will be delivered into the reaction tube by supplying $N_2$ gas at 0.5 l./min. into the impurity source for 30 minutes, and the quantity of $O_2$ required to completely react with said quantity of $POCl_3$ will be estimated about 0.015 l./min. This quantity of $O_2$ corresponds to about 0.6% of that in the entire carrier gas caused to flow into the reaction tube.

As described hereinabove with reference to FIGS. 4 and 5, the inventors have found that when a mixture layer consisting of phosphorus oxide and silicon oxide or glass layer is formed on the surface of such a semiconductor element as shown in FIG. 2*a*, there occurs a difference in thickness between the glass layer formed on the silicon oxide layer and that formed on the surface of the silicon substrate. In this way, there is produced a semiconductor element comprising a mixture layer of phosphorus oxide and silicon oxide or glass layer and a phosphorus diffused layer, as shown in FIG. 2*b*. In the drawing, the thickness of the mixture layer is shown as being exaggerated. By way of example, the mixture layer is 2600 A. and 2000 A. in thickness on the silicon oxide layer 22 and the silicon substrate, respectively, and the phosphorus diffused layer 24 has a thickness of about 0.5 to 2$\mu$.

Figure 2C:
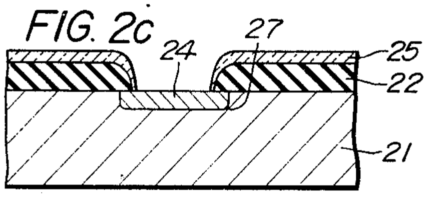

Subsequently, the surface of the semiconductor element is immersed in an etchant so that the mixture layer of phosphorus oxide and silicon oxide is etched. In this case, the etching is effected to such an extent that the mixture layer on the surface of the silicon substrate is completely removed while the mixture layer on the silicon oxide layer is left, as shown in FIG. 2*c*.

Figure 6:
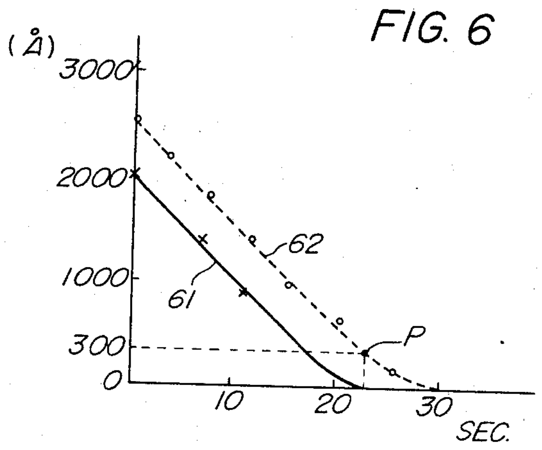

FIG. 6 shows how the mixture layer is etched when the element as shown in FIG. 2*b* is immersed in, for example, a mixed etchant solution of HF and $NH_4F$. In FIG. 6, the horizontal axis shows the etching time, the vertical axis indicates the thickness of the residual mixture layer and the curves 61 and 62 represent the state of the mixture layer on the surface of the silicon substrate and that of the mixture layer on the silicon oxide layer, respectively. From this figure, it will be seen that if the etching is effected for about 24 seconds, the mixture layer on the surface of the silicon substrate is completely removed so that the surface of the substrate or the phosphorus diffused layer 24 is exposed while at this time such mixture layer about 300 A. in thickness remains on the silicon oxide layer. If the etching is effected for 30 seconds or longer, the mixture layer on the silicon oxide layer is also completely removed. This is undesirable for the present invention. Obviously, however, the etching time may be suitably selected depending upon the type and composition of an etchant solution in use.

In case use is made of an etchant solution having a composition of $HF:NH_4F=1:15$, the mixture layer on the surface of the silicon substrate is removed in about 30 seconds while the mixture layer on the silicon oxide layer cannot completely be removed unless the etching is continued for about 45 seconds. Thus, the use of such etchant solution caused the mixture layer about 300 to 500 A. in thickness to be left only on the silicon oxide layer when the etching was effected for 35 seconds. It is also possible to employ another etchant consisting of HF, $HNO_3$ and $H_2O$. In the case where use is made of an etchant having a composition of $$HF:HNO_3:H_2O=10:15:1000$$

for example, the mixture layer of about 300 A. could be left on the silicon oxide layer by effecting the etching for about 24 seconds as is the case with the use of the etchant having a composition of $HF:NH_4F=1:10$ as described above.

As is also seen from FIG. 6, the etching rate of the mixture layer consisting of silicon oxide and phosphorus oxide with respect to the etchant initially assumes a substantially constant value of about 100 A./second as the etching progresses, but if the thickness of the mixture layer becomes smaller than about 200 A., such etching rate becomes very low. In the example shown in FIG. 6, for instance, the etching rate is decreased down to about 30 to 40 A./second. Consequently, it follows that when the mixture layer on the silicon substrate is to be completely removed, the mixture layer remaining on the silicon oxide layer is not 500 A. but about 300 A. in thickness at the time when the mixture layer on the surface of the silicon substrate has been completely removed by etching it for about 24 seconds, even though the difference in thickness between the mixture layer on the silicon oxide layer and that on the surface of the silicon substrate was about 500 A. prior to the etching.

Figure 2D:
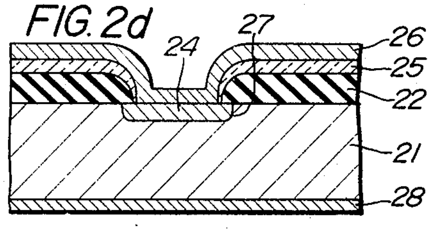

Subsequently, a metal such as aluminum is evaporated onto the semiconductor element thus produced, so that there is formed a metal electrode 26 reaching the diffused layer 24 in the silicon substrate, as shown in FIG. 2*d*. In a method of manufacturing a semiconductor device, it is a usual practice that the surface of the silicon substrate is washed by immersing the semiconductor element in an etchant for a short period of time prior to the evaporation of aluminum for the purpose of causing the aluminum electrode to be placed in perfect contact with the diffused layer. For example, the element may be immersed in an etchant with a composition of $HF:NH_4F=1:10$ for about 2 to 3 seconds prior to the evaporation of aluminum. In this case, the mixture layer of phosphorus oxide and silicon oxide on the silicon oxide layer will be further etched by 100 to 200 A., and thus the mixture layer ultimately left on the silicon oxide layer will have a thickness of about 100 A.

The inventors consider that with a diode or transistor having a normal PN junction, it is required that a mixture layer consisting of phosphorus oxide and silicon oxide at least about 50 A. in thickness be provided on the silicon oxide layer in order to obtain such excellent electrical characteristics as described above.

Consequently, in the method of this invention, it is desired that the mixture layer as shown in FIG. 2*b* be formed in such a manner that the mixture layer on the silicon oxide layer becomes 500 A. thicker than that on the surface of the silicon substrate, with the safety factor for each of the various steps being taken into consideration. A diode can be produced by additionally providing a metal electrode 28 on the back surface of the substrate as shown in FIG. 2*d*, as desired.

In this way, there has been produced a semiconductor device comprising the P type substrate 21, PN junction 27 formed between the substrate 21 and the phosphorus diffused layer 24, silicon oxide layer 22 covering termination of the PN junction which reaches the surface of the substrate, mixture layer 25 of phosphorus oxide and silicon oxide covering said layer 22, and metal electrode 26 extending from said diffused layer 24 over the termination of said PN junction through said insulating layers 22 and 25.

Figure 1D:
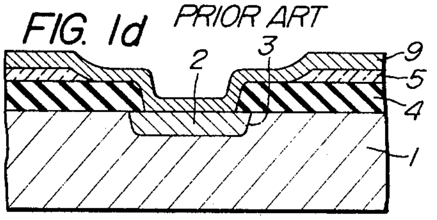
FIG. 1d PRIOR ART

It has been confirmed that such a semiconductor device is remarkably improved in electrical characteristics, especially in reverse current characteristics over the prior semiconductor device as described with reference to FIG. 1*d*, since the termination of the PN junction thereof is covered with the insulating layers containing phosphorus oxide.

As described in the foregoing, the method of manufacturing a semiconductor device in accordance with the present invention is characterized in that the surface of the mixture layer is uniformly etched without using any mask when a hole is formed in the mixture layer or glass layer for the purpose of attaching an electrode after the formation of the mixture layer or glass layer which consists of phosphorus oxide and silicon oxide. Therefore, if the dimension of the semiconductor device as described with reference to FIG. 2*a* is to be reduced to such an extent that, for example, the exposed surface of the substrate has such a small area that its diameter is about 5$\mu$, application of the present invention is substantially not affected.

Through further experiments, the inventors have succeeded in providing a difference in thickness of about 1000 A. between the mixture layer formed on the silicon oxide and that formed on the silicon substrate. That is, in the experimental apparatus as shown in FIG. 3, an impurity source consisting of a phosphorus compound was fed into the reaction tube under a saturated condition by supplying thereinto a mixed gas of $N_2$ and $O_2$ as gas B at a rate of 0.8 l./min. while the valve 36 is closed and the valve 37 is opened, and the thickness of the mixture layer of phosphorus oxide and silicon oxide or glass layer formed on the semiconductor element 31 in about 30 minutes by controlling the composition of the mixed gas was measured. FIG. 7 illustrates the experimental results. In this experiment, use was made of $POCl_3$ maintained at 0 to 5° C. as the impurity source 35, as in the previous experiment, and the reaction tube was internally heated at about 1025° C. by means of the heating device 33. In FIG. 7, the horizontal axis indicates the ratio $O_2$ in the gas B in percent, and the vertical axis shows the thickness of the mixture layer or glass layer formed on the semiconductor element (unit: A.). The curves 71 and 72 represent the state of the mixture layer or glass layer formed on the silicon substrate and that of such layer formed on the silicon oxide layer, respectively. As will be seen from FIG. 7, the experimental results show that by decreasing the quantity of $O_2$ contained in the gas B down to about 20% or less, there occurs a difference of about 1000 A. in thickness between the mixture layer formed on the silicon substrate and that formed on the silicon oxide layer.

In the present experiment, about 5.8 gr. of $POCl_3$ was delivered into the reaction tube in about 30 minutes by supplying a mixed gas of $N_2$ and $O_2$ at the rate of 0.8 l./min. into the impurity source 35 of $POCl_3$. In this case, the necessary quantity of $O_2$ to completely react with said 5.8 gr. of $POCl_3$ to form $P_2O_5$ was estimated about 0.023 l./min.

Figure 7:
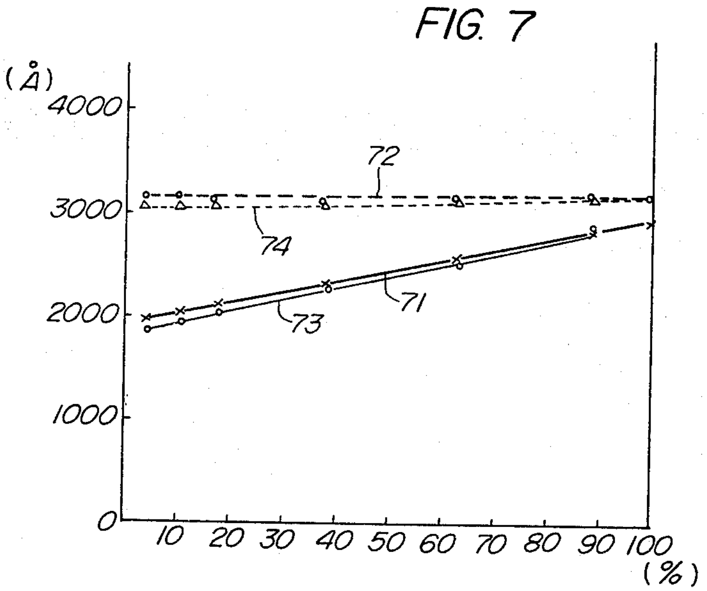

The inventors performed another experiment by using as the impurity source phosphorus trichloride ($PCl_3$) or phosphorus tribromide ($PBr_3$) instead of $POCl_3$, and obtained substantially similar results to those obtained by using $POCl_3$, as represented by the curves 73 and 74 in FIG. 7. The curves 73 and 74 represent the state of the mixture layer formed on the silicon substrate surface and that of such layer formed on the silicon oxide layer, respectively.

In the respective experiments described above, $N_2$ was used as the inert gas to be contained in the carrier gas, but use can equally be made of argon Ar, helium He or the like instead of $N_2$.

Now, description will be made of concrete examples of the method of fabricating various transistors or semiconductor integrated devices through the use of the method of manufacturing the semiconductor device according to the present invention.

Example 1

With reference to FIGS. 8*a* to 8*f*, the method of fabricating an NPN transistor will be described.

Figure 8A:
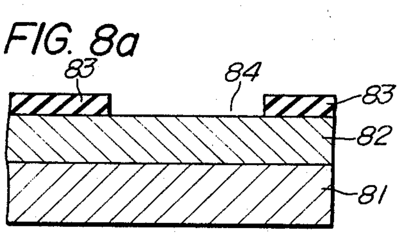
FIGS. 8*a* through 8*f* are sectional views illustrating the fabrication of an NPN silicon transistor in accordance with the present invention.

FIG. 8*a*: First, an N type silicon substrate 81 having a thickness of about 250$\mu$ and a resistivity of about 0.01 Ωcm. is prepared. This substrate is heated at about 1200° C. in the reaction tube, and silicon tetrachloride ($SiCl_4$) and hydrogen ($H_2$) gas containing a small quantity of an N type impurity are delivered thereto so as to cause $SiCl_4$ to be reduced with $H_2$. Thus, an N type silicon epitaxial layer 82 having a thickness of about 10 to 15$\mu$ and a resistivity of about 1 Ωcm. is formed on said substrate 81. By heating the substrate at a temperature above 1000° C. in a wet oxygen atmosphere, a silicon oxide film 83 with a thickness of about 10,000 A. is formed on said epitaxial layer 82. Thereafter, a hole 84 is formed in the film 83 in such a manner as to reach the silicon layer 82 through the use of the conventional photo-etching technique.

Figure 8B:
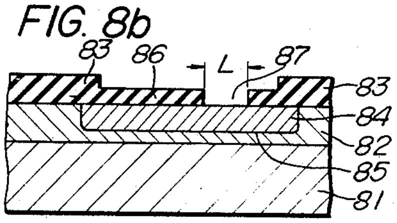

FIG. 8*b*: Such semiconductor wafer is subsequently heated at about 1100° C. in a boron atmosphere so that a P type diffused base layer 84 with a thickness of about 1.8$\mu$ is formed in said N type epitaxial layer 82 and simultaneously a new silicon oxide film 86 having a thickness of about 6000 A. is formed on the surface of the diffused layer 84. Furthermore, a hole with a width L of about 5$\mu$ is formed by the conventional photo-etching technique, so that said diffused layer is partially exposed.

Figure 8C:
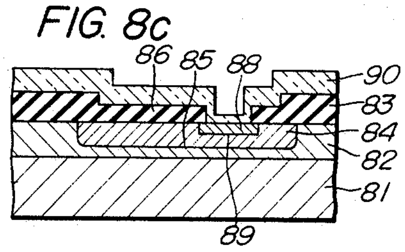

FIG. 8*c*: Phosphorus oxide is deposited on the surface of the semiconductor element by the method based on the inventors' experiments described in detail hereinbefore, so that a mixture layer of phosphorus oxide and silicon oxide is formed. For example, such mixture layer is formed in a thickness of about 3200 A. on the silicon oxide films 83 and 86 and in a thickness of about 2200 A. on the exposed surface of the P type diffused layer 84. In this case, a phosphorus diffused emitter region 88 with a depth of about 1.2$\mu$ is formed in said P type diffused layer 84 so that a second PN junction 89 is formed.

Figure 8D:
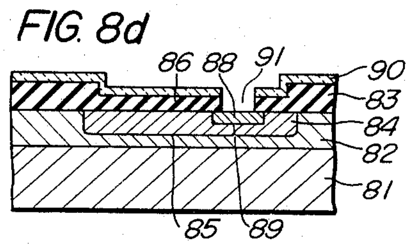

FIG. 8*d*: The said semiconductor element is immersed in an etchant with a composition of $HF:NH_4F=1:10$ for about 25 seconds to etch the mixture layer or glass layer 90 on the said element. At this time, the mixture layer on the phosphorus diffused region 88 is removed, while such mixture layer about 600 to 800 A. in thickness remains on the silicon oxide films 83 and 86.

Figure 8E:
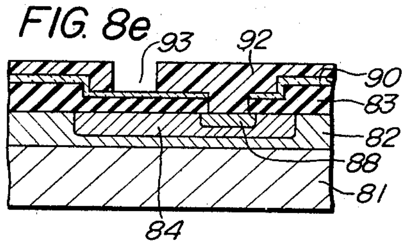

FIG. 8*e*: In order to form a hole for forming an electrode reaching said P type diffused layer 84, a corrosion resisting mask 92 is provided, and that portion 93 of the mixture layer where no such mask is provided and the silicon oxide layer therebeneath are etched away by the conventional photo-etching technique, so that the P type diffused layer 84 is partially exposed.

Figure 8F:
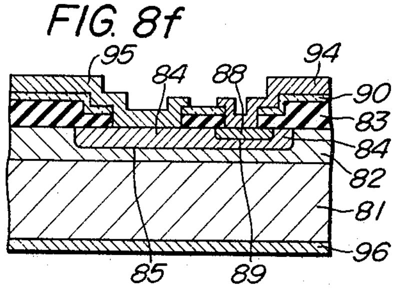

FIG. 8*f*: The corrosion resisting film 92 is removed, thereafter a metal such as aluminum is vacuum-deposited on the surface of the semiconductor element, and then the resulting metal layer is configured into a suitable pattern by the conventional photo-etching technique. A metal electrode is also provided on the back surface of the silicon substrate 81.

In this way, there is produced an NPN transistor having an emitter electrode 94, base electrode 95 and collector electrode 96.

Figure 9:
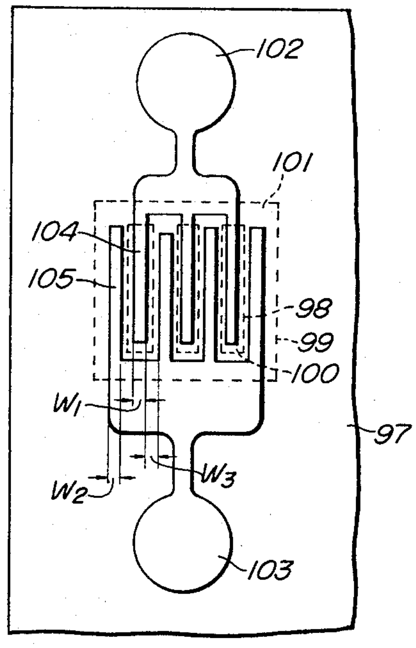
FIG. 9 is a plan view showing a portion of a transistor fabricated in accordance with the present invention.

FIG. 9 is a top plan view showing an example of the electrode pattern of the transistor thus produced. In this figure, the reference numeral 97 represents an insulating coating consisting of silicon oxide and phosphorus oxide provided on the silicon material. The dotted lines 98 and 99 show respectively the contour of the termination of the PN junction between the emitter and the base and that of the termination of the PN junction between the base and the collector. The reference numeral 100 denotes an emitter diffused region, 101 a base diffused layer, and 102 and 103 metal electrodes extending from the emitter region and base layer over the insulating coating.

In a transistor having such an electrode pattern, it is required that the widths $W_1$ and $W_2$ of the emitter and base electrodes 104 and 105 having a comb-like structure be made narrow or that the spacing $W_3$ between the electrodes 104 and 105 be made small, in order to improve the high frequency characteristics thereof. In accordance with the method of the present invention, however, such transistor can readily be manufactured without having no adverse effect on the electrical characteristics. Through the use of the method according to the present invention, the inventors have succeeded in the fabrication of a high-frequency transistor with such a minute electrode structure that $W_1$, $W_2$ and $W_3$ are approximately 4 to 5$\mu$.

Example 2

Figure 10A:
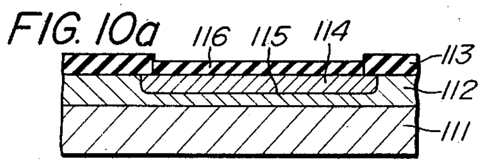
FIGS. 10*a* through 10*f* are sectional views illustrating the fabrication of a PNP silicon transistor in accordance with the present invention.

With reference to FIGS. 10*a* thorugh 10*f*, description will now be made of the case where a PNP transistor is fabricated.

FIG. 10*a*: A P type silicon epitaxial layer 112 having a resistivity of about 10 Ωcm. and a thickness of about 20$\mu$ is formed on a P type silicon substrate 111 having a thickness of about 200$\mu$ and a resistivity of about 0.1 Ωcm. An N type impurity such as antimony (Sb) or arsenide (As) is selectively diffused into said epitaxial layer through using a silicon oxide layer 113 provided on the epitaxial layer 112 as a mask, thereby forming an N type base diffused region 114. At this time, a new silicon oxide layer 116 is formed on the diffused region.

Figure 10B:
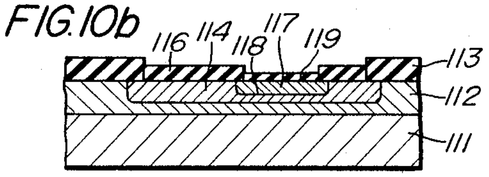

FIG. 10*b*: A hole is formed in the newly formed silicon oxide layer, and boron is selectively diffused into said N type diffused region through the hole to form a P type emitter diffused layer 117. At this time, too, a new silicon oxide layer 119 is formed on the P type diffused layer 117.

Figure 10C:
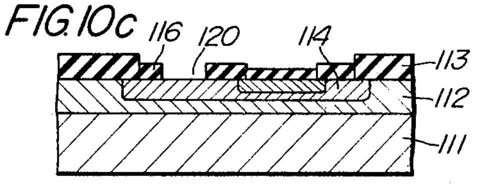

FIG. 10*c*: Subsequently, a hole 120 for forming an electrode for the N type base diffused layer 114 is formed in the silicon oxide layer 116 by the conventional photo-etching technique.

Figure 10D:
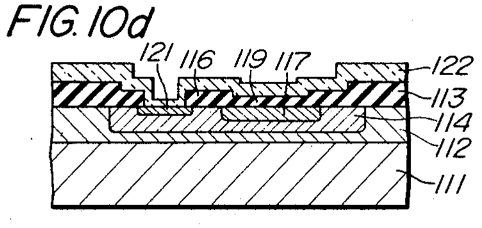

FIG. 10*d*: A mixture layer 122 of phosphorus oxide and silicon oxide is formed in a thickness of about 2600 A. on the silicon oxide layers 113, 116 and 119 and in a thickness of about 2000 A. on the surface of the N type base diffused region 114 which is exposed through said hole 120, by the method based on the inventors' experiments described above. In this case, an N type highly doped region 121 with a depth of about 1 to 2$\mu$ is formed in the N type base region 114.

Figure 10E:
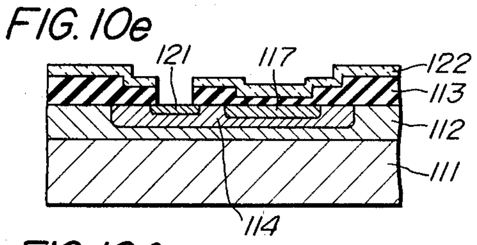

FIG. 10e: Such semiconductor element is immersed in an etchant with a composition of $HF:NH_4F=1:10$ for about 25 seconds to etch said mixture layer 122. Through this etching process, the mixture layer on the surface of the N type highly doped region 121 is completely removed so that the surface thereof is exposed, while such mixture layer about 300 A. in thickness still remains on the silicon oxide layers 113, 116 and 119.

Figure 10F:
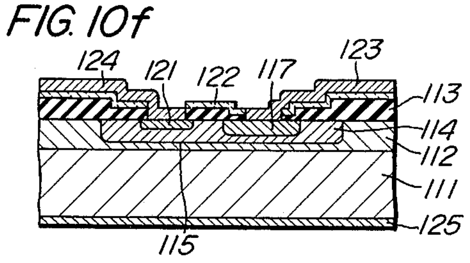

FIG. 10f: A hole is again formed which reaches the emitter diffused region 117 by the use of the conventional photo-etching technique, and a metal such as aluminum is evaporated onto such semiconductor element from above to form an emitter electrode 123 and a base electrode 124. Als, a metal electrode is formed on the back surface of the P type substrate 111. Thus, a PNP transistor can be produced.

In the transistor thus produced, the highly doped phosphorus region 121 serves to provide a good ohmic contact between the base layer 114 with a relatively high resistivity and the metal electrode 124 and also to decrease the base spreading resistance in the base layer 114. In a PNP transistor fabricated by the method described, the termination of the PN junction 115 between the base and the collector extending to the surface of the epitaxial layer is completely covered with a layer consisting of silicon oxide and phosphorus oxide. It has been confirmed that such transistor possesses such excellent electrical characteristics as described above.

Example 3

With reference to FIGS. 11a through 11d, description will now be made of the case where an insulated gate type field effect transistor is fabricated through the use of the method of the present invention.

Figure 11A:
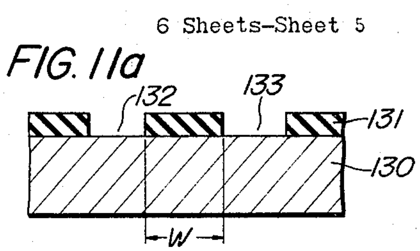
FIGS. 11*a* through 11*d* are sectional views illustrating the fabrication of an insulated gate type field effect transistor in accordance with the present invention.

FIG. 11a: First, preparation is made for a P type silicon wafer 130 having a thickness of about 200μ and a resistivity of about 1 Ωcm. This wafer 130 is subjected to heat treatment at about 1200° C. in a wet oxygen atmosphere for about 10 minutes to form a silicon oxide film 131 having a thickness of about 2500 A. on the surface of the wafer 130. Then, holes 132 and 133 extending to the surface of the silicon wafer are formed in the silicon oxide film 131 by the conventional photo-etching technique. In an insulating gate type field effect transistor, it is required that the spacing between the source region and the drain region or the length W of the gate region be made as small as possible in order to improve the electrical characteristics, especially the mutual conductance gm. In this example, the length W of the gate region was selected to be $W \simeq 5\mu$.

Figure 11B:
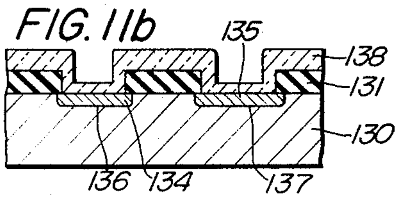

FIG. 11b: On the basis of the inventors' experimental results described hereinbefore, phosphorus oxide is deposited on the surface of said wafer to enable phosphorus to be diffused into the exposed surface of the P type silicon wafer so that N type diffused regions 134 and 135 having a depth of about 2μ are formed therein. Between the N type diffused regions 134 and 135 and the P type wafer are formed PN junctions whereby the regions 134 and 135 and the wafer are separated from each other, thus defining the source region and drain region in a field effect transistor. During this treatment process, a mixture layer of phosphorus oxide and silicon oxide or glass layer is formed in a thickness of about 2500 A. on the silicon oxide layer 131 and in a thickness of about 2000 A. on the silicon surface.

Figure 11C:
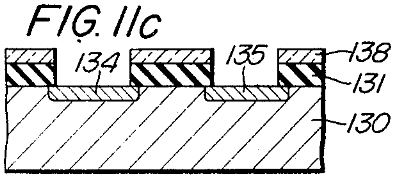

FIG. 11c: The semiconductor element thus obtained is etched in an etchant solution with a composition of $HF:NH_4F=1:10$ for about 25 seconds, so that the mixture layer on said source and drain regions 134 and 135 is completely removed while such mixture layer about 300 A. in thickness is left on the silicon oxide layer 131.

Figure 11D:
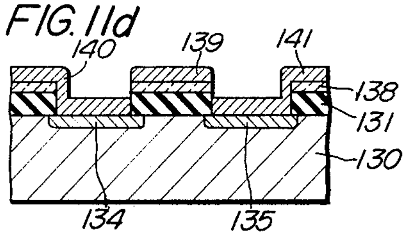

FIG. 11d: Subsequently, a metal such as aluminum or chromium is vacuum-deposited on the element from above to form a source electrode 140 and a drain electrode 141 on the source region 134 and the drain region 135, respectively, and to form a gate electrode 139 on the insulating layer between the source and drain regions. In this way, an insulated gate type field effect transistor is fabricated.

Although the spacing between the source and the drain is as small as 5μ, the transistor thus produced has very stable electrical characteristics since the substrate surface between the source and the drain is covered with the mixture or glass layer of silicon oxide and phosphorus oxide through the use of the method of the present invention.

Example 4

Figure 12:
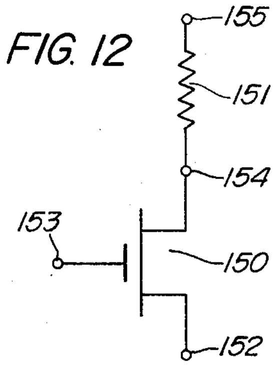
FIG. 12 is a circuit diagram including an insulated gate type field effect transistor and a resistor which are used in explaining an embodiment of the present invention.

With reference to FIGS. 13a through 13e, description will now be made of the steps of manufacturing a so-called semiconductor integrated circuit having an insulated gate type field effect transistor 150 and a resistor 151 incorporated in a single semiconductor substrate as shown in FIG. 12.

Figure 13A:
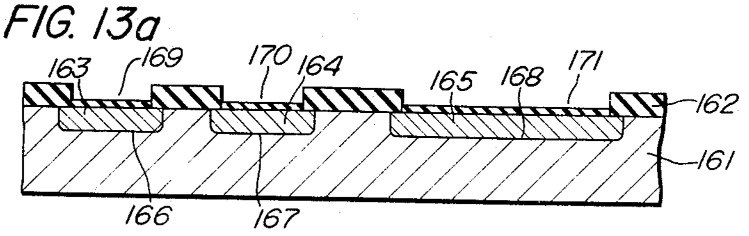
FIGS. 13*a* through 13*e* are sectional views illustrating the fabrication of an integrated circuit device according to the present invention, the circuit diagram of which being illustrated in FIG. 12.

FIG. 13a: First, a P type silicon substrate with a thickness of about 250μ and a resistivity of about 1 Ωcm. is prepared. This substrate is subjected to heat treatment at about 1200° C. in a wet oxygen atmosphere to form a silicon oxide layer 162 with a thickness of about 8000 A. on the surface of the substrate. Subsequently, holes 169, 170 and 171 are formed in the silicon oxide layer 162 in such a manner as to extend to the surface of the substrate. Thereafter, an N type impurity such as, for example, arsenide or antimony is selectively diffused through the holes to form N type diffused layers 163, 164 and 165 in the silicon substrate through PN junctions 166, 167 and 168. At this time, a thin silicon oxide layer is newly formed on the respective diffused layers.

Figure 13B:
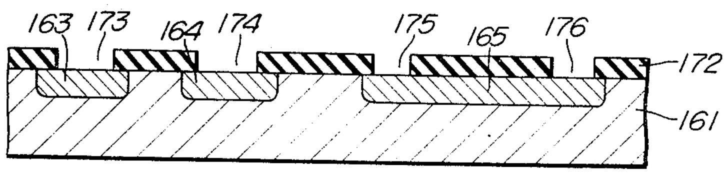

FIG. 13b: Subsequently, the semiconductor element thus formed is immersed in a HF solution to completely remove the silicon oxide layer formed on the silicon substrate surface. Thereafter, the semiconductor element is subjected to heat treatment at 1200° C. in wet oxygen for about 15 minutes so that a silicon oxide layer 17 is formed on the silicon substrate surface. This oxide layer has a thickness of about 3000 A. Holes 173, 174, 175 and 176 are formed in the silicon oxide layer 172 in such a manner as to extend to said N type diffused layers 163, 164 and 165 through the use of the conventional photo-etching technique.

Figure 13C:
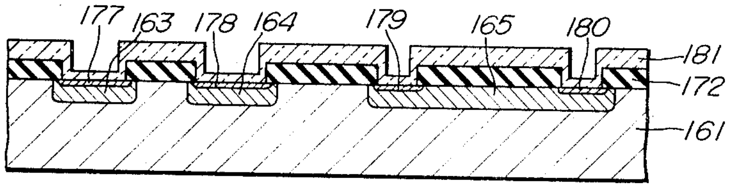

FIG. 13c: The element is inserted into a reaction tube heated at about 1020° C. $POCl_3$ is used as the impurity source. A mixed gas of $N_2$ and $O_2$ as the carrier gas for the impurity source is supplied into said reaction tube at a rate of about 2.5 l./min. ($O_2$ at 0.5 l./min. and $N_2$ at 2.0 l./min.) to cause phosphorus to be diffused into the substrate through said holes 173, 174, 175 and 176 so that highly doped phosphorus regions 177, 178, 179 and 180 are formed in the N type diffused layers 163, 164 and 165, respectively, as shown in the drawing. A mixture layer or glass layer 181 of silicon oxide and phosphorus oxide is formed in a thickness of about 2500 A. on the silicon oxide layer 172 and in a thickness of about 2000 A. on said highly doped phosphorus regions 177, 178, 179 and 180.

Figure 13D:
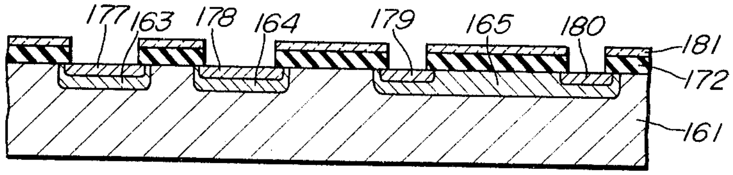

FIG. 13d: Such semiconductor element is immersed in an etchant solution with a composition of $$HF:NH_4F=1:10$$

for about 25 seconds so that the mixture layer on the highly doped regions 177, 178, 179 and 180 is completely removed while such mixture layer about 200 to 300 A. in thickness is left on the silicon oxide layer.

Figure 13E:
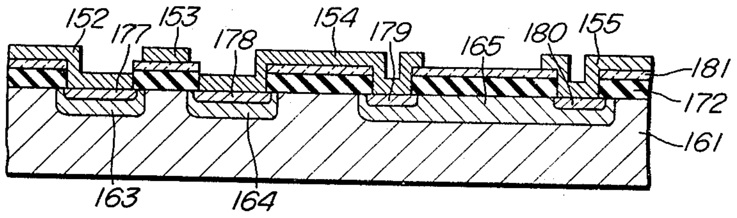

FIG. 13e: Thereafter, a metal such as aluminum is evaporated onto the semiconductor element from above. Furthermore, thus evaporated metal layer is etched in a metal etching solution by using the conventional photo-etching technique, so that metal electrodes and interconnections which are configured in a suitable pattern are formed. The metal electrodes 152, 153 and 154 constitute the source, gate and drain electrodes of the insulated gate type transistor described with reference to FIG. 12. Also, the metal electrodes 154 and 155 constitute the electrode terminals on the opposite ends of the resistor 151. In FIG. 13*e*, the N type diffused region 165 serves as the resistor 151.

In this way, such a circuit arrangement as shown in FIG. 12 is formed in the single semiconductor substrate.

While the present invention has been particularly shown and described with reference to preferred embodiments thereof, it will be readily understood by those skilled in the art that the foregoing and other changes in form and details may be made therein without departing from the spirit and scope of the invention.

We claim:

1. A method of manufacturing a semiconductor device, comprising the steps of:

(a) preparing a combination of a silicon substrate and a silicon oxide layer so formed as to cover at least part of the surface of said substrate, the surface portion of the substrate which is not covered with said silicon oxide layer being exposed to the outside;

(b) depositing phosphorus oxide on the surface of said combination to form a mixture layer of phosphorus oxide and silicon oxide in a greater thickness on said silicon oxide layer and in a smaller thickness on said exposed substrate surface; and (c) uniformly exposing the surface of said combination to an etchant to etch said mixture layer provided on the surface of said combination to such an extent that the mixture layer formed on said substrate surface is removed so that the substrate surface is again exposed while the mixture layer formed on said silicon oxide layer is left.

2. A method of manufacturing a semiconductor device according to claim 1, characterized by causing phosphorus to be diffused into the silicon substrate to form N type diffused layer when the mixture layer of phosphorus oxide and silicon oxide is formed on the exposed silicon substrate surface by depositing phosphorus oxide on the surface of said combination in said step (b).

3. A method of manufacturing a semiconductor device according to claim 1, characterized by including a further step of depositing a metal film on said re-exposed substrate surface, subsequent to said step (c).

4. A method of manufacturing a semiconductor device according to claim 1, characterized in that said step (b) is achieved by placing said combination prepared in said step (a) in a reaction tube and delivering a gasified phosphorus compound and a carrier gas conveying said compound into said reaction tube, said carrier gas consisting of oxygen and an inert gas, the quantity of oxygen contained in the entire carrier gas being at most 20%.

5. A method of manufacturing a semiconductor device according to claim 2, characterized in that said silicon substrate is formed of a P type monocrystalline body, and that a PN junction is formed between said N type diffused layer and said P type body, the termination of said PN junction reaching to the substrate surface being covered with said silicon oxide layer and the mixture layer thereon.

6. A method of manufacturing a semiconductor device according to claim 1, characterized by forming the mixture layer on said combination in such a manner that the difference in thickness between the mixture layer formed on said silicon oxide layer and that formed on said silicon substrate surface becomes at least 500 A.

7. A method of manufacturing a semiconductor device wherein a silicon semiconductor substrate having its surface at least partially exposed to the outside and the remaining surface entirely covered with a silicon oxide layer is placed in a reaction tube, and a carrier gas is introduced into said reaction tube together with a gasified phosphorus compound to form a mixture layer of phosphorus oxide and silicon oxide on said exposed substrate surface and said silicon oxide layer, characterized by that said carrier gas contains oxygen in such a quantity that phosphorus oxide is formed through reaction of oxygen with said phosphorus compound, and that said mixture layer is formed in such a manner that the mixture layer formed on said silicon oxide layer becomes at least 500 A. thicker than that formed on the substrate surface.

8. A method of manufacturing a semiconductor device according to claim 7, characterized in that said phosphorus compound is one selected from a group of $POCl_3$, $PCl_3$ and $PBr_3$.

References Cited

UNITED STATES PATENTS 3,394,037 7/1968 Robinson ---------- 148—187

L. DEWAYNE RUTLEDGE, Primary Examiner

R. A. LESTER, Assistant Examiner

U.S. Cl. X.R.

29—578; 148—188